United States Patent [19]
Colina et al.

[11] Patent Number: 6,020,256
[45] Date of Patent: Feb. 1, 2000

[54] METHOD OF INTEGRATED CIRCUIT FABRICATION

[75] Inventors: Alberto Colina; Benito Herrero, both of Tres Cantos, Spain

[73] Assignee: Lucent Technologies Inc., Murray Hill, N.J.

[21] Appl. No.: 08/769,605

[22] Filed: Dec. 18, 1996

[51] Int. Cl.[7] .................................................. H01L 21/4763
[52] U.S. Cl. .......................... 438/626; 438/631; 438/645; 438/948; 438/949
[58] Field of Search ....................... 438/626, 631, 438/645, 948, 949; 430/311, 312, 313, 314, 315, 316, 317, 318

[56] References Cited

U.S. PATENT DOCUMENTS 5,213,992  5/1993  Lu .
5,609,994  3/1997  Lee .

Primary Examiner—John F. Niebling
Assistant Examiner—Josetta Jones
Attorney, Agent, or Firm—William S. Francos

[57] ABSTRACT

Dielectric planarization is achieved by Defocus and under exposure of photoresist. The photoresist may be etched at the same rate as the dielectric, thereby yielding a smooth or planarized dielectric.

9 Claims, 3 Drawing Sheets

METHOD OF INTEGRATED CIRCUIT FABRICATION

TECHNICAL FILED

This invention relates in general to methods of integrated circuit fabrication, and more particularly, to methods for smoothing or partially planarizing dielectric layers.

BACKGROUND OF THE INVENTION

Integrated circuits frequently utilize planarized or smoothed dielectric layers. Planarized or smoothed dielectric layers facilitate the subsequent formation of overlying reliable conductive runners.

One planarization or smoothing process is depicted in FIGS. 1–5. In FIG. 1, substrate 11 denotes a substrate which may illustratively be a dielectric or an oxide of silicon. In general, the term "substrate" means a layer which lies beneath or supports other layers. Reference numerals 13 and 15 denote conductive runners which may contain substantial amounts of aluminum, tungsten, copper, etc. Reference numeral 17 denotes a dielectric, illustratively containing predominantly an oxide of silicon formed from a chemical precursor. Dielectric 17 is somewhat conformal and exhibits a recess 19 between (and slightly above) runners 13 and 15.

FIGS. 2–5 illustrate one method for smoothing or planarizing dielectric 17 in the vicinity of recess 19. In FIG. 2, a photoresist 21 is deposited and patterned using conventional sharp focus. After the photoresist has been developed, unwanted resist is washed away and a portion of the photoresist 21 remains above recess 19.

Next, the wafer is inspected with SEM (scanning electron microscope) apparatus to ensure that recesses 19 are fully covered and then (using either an optical microscope or overlay machine) that photoresist 21 is reasonably aligned with recess 19. Typically, it is also necessary to measure the dimensions of photoresist 21 with a SEM.

Next, in FIG. 3, photoresist 21 is formed by heating it to a temperature of approximately 150° C. for a period of time of approximately 1 minute, followed by a second heating step at approximately 225° C. for approximately 1 minute.

In FIG. 4, an additional new blanket layer of photoresist 23 is then applied.

Next, an etching process is performed. The etching process etchs photoresist 21 and 23 at approximately the same rate as dielectric 17. FIG. 5 schematically illustrates the portion of the wafer after the etching process has been completed. Recess 19 has been at least partially eliminated (although a small recess 25 may still remain). Generally the upper surface 27 of dielectric 17 is smoother or more planar than the upper surface 31 of dielectric 17 in FIG. 1.

The above process, is somewhat long and cumbersome, requires two photoresist applications, and a heating step which impacts the thermal budget. Those concerned with the development of integrated circuit fabrication have consistently sought better methods of planarization.

SUMMARY OF THE INVENTION

The present invention includes a method of integrated circuit fabrication including:
forming a material layer upon a substrate, the material layer having a topography with at least one recess:
forming a layer of photoresist upon the material layer;
under exposing the photoresist to light through a mask, the mask having a feature generally above the recess; the light being defocused; developing the photoresist; etching the photoresist and the material layer at approximately the same rate to thereby smooth the material layer.

Instead of under exposure, under development of a fully exposed resist may be performed.

DETAILED DESCRIPTION

Figure 1:
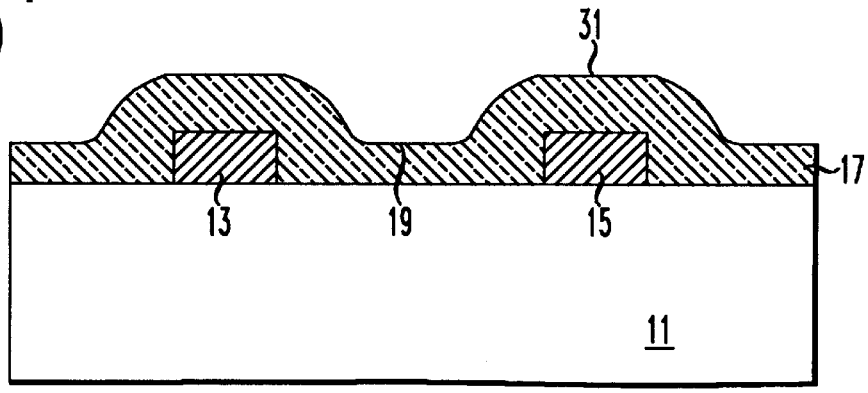
FIGS. 1–5 are partial cross-sectional views of a wafer fabricated according to the aforedescribed previously-practiced process.
Figure 6:
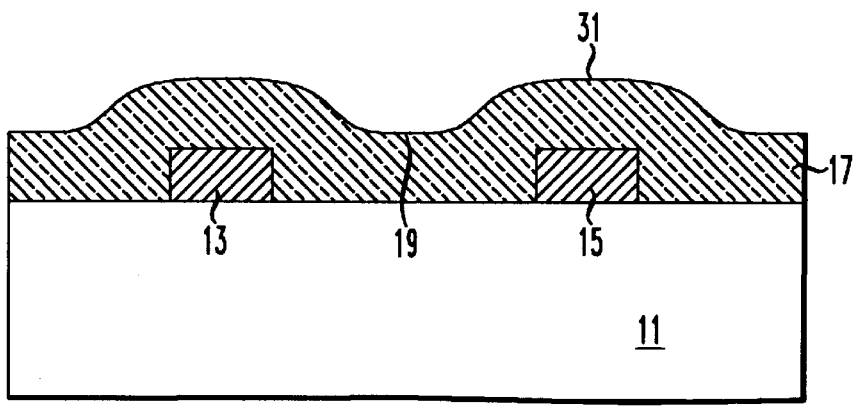
FIGS. 6–10 are partial cross-sectional views of a wafer undergoing an illustrative embodiment of the process of the current invention.

FIG. 6, an initial configuration, is similar to FIG. 1. Runners 13 and 15 are spaced apart from substrate 11 and covered by dielectric 17.

Figure 7:
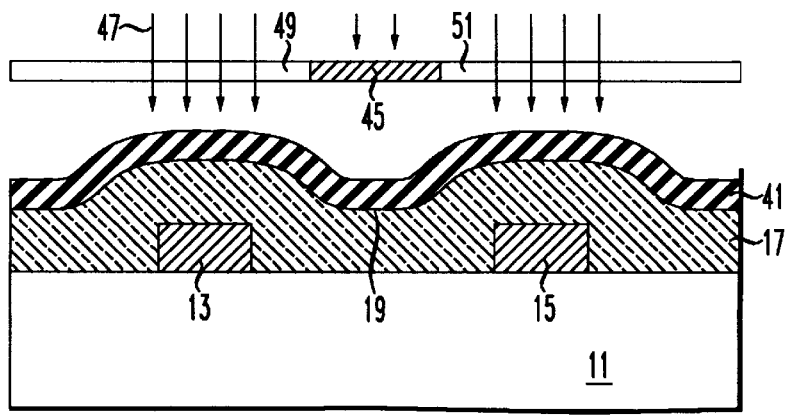

In FIG. 7, photoresist 41 is blanket deposited over dielectric 17. Photoresist 41 is exposed to radiation through reticle 43. Reticle 43 has a chromed portion 45 which is positioned generally above recess 19. Light 47 passes through transparent portions 49 and 51 of reticle 43.

Figure 2:
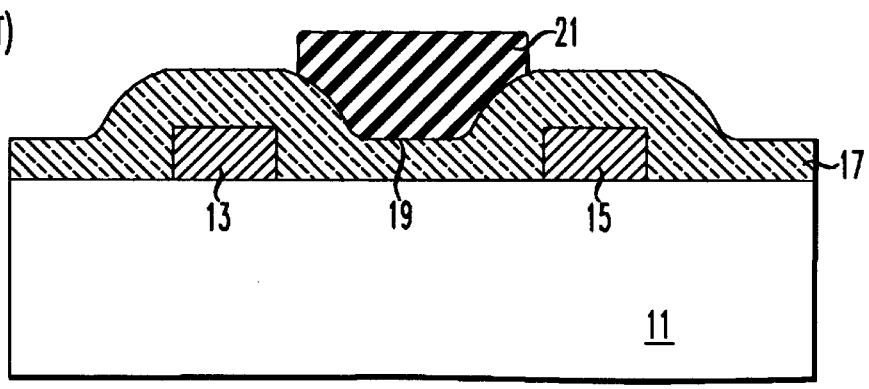

However, unlike previous practice (which created patterned dielectric patterned photoresist 21 of FIG. 2), in the present process, the light traversing reticle 43 is, illustratively:

i) defocused; and ii) under exposed.

Figure 3:
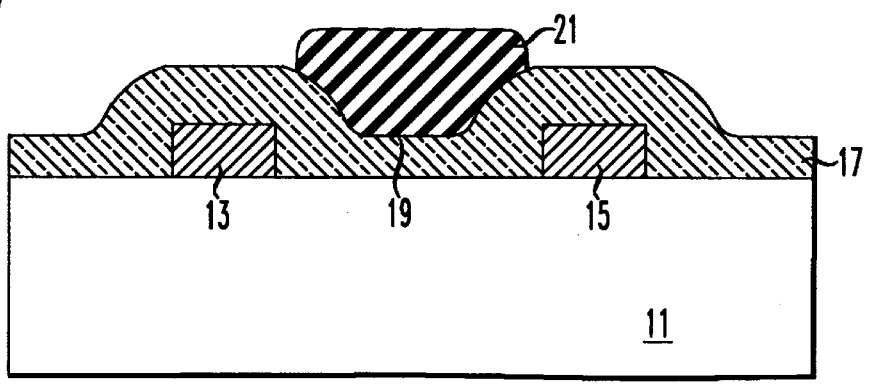

Either defocusing or under exposure may be employed individually, but the two steps in combination are more effective than one step alone. The defocusing produces a portion 57 of photoresist 41 which is demarcated by phantom lines 53 and 55. Photoresist portion 57 may be compared with photoresist portion 21 of FIG. 3. It will be noted that the defocusing step has created a photoresist feature with smooth, rounded sides akin to feature 21 of FIG. 3 which was produced uilizing sharp focus and a subsequent heating step.

Furthermore, the underexposure of photoresist 41 produces portions 59 and 61 (FIG. 8) of photoresist 41 which are not washed away by the photoresist development process. In other words, because of the under exposure, chemical bonds in the photoresist are not completely broken, and the developer liquid does not completely remove the exposed photoresist.

Under development of a fully exposed photoresist may also be performed. For example, instead of development for 1 minute, under development may be performed in approximately 20 seconds.

Figure 4:
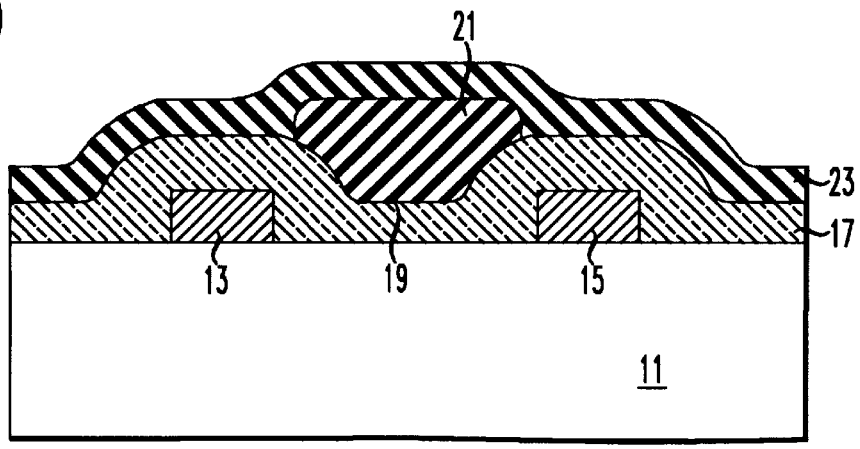
Figure 5:
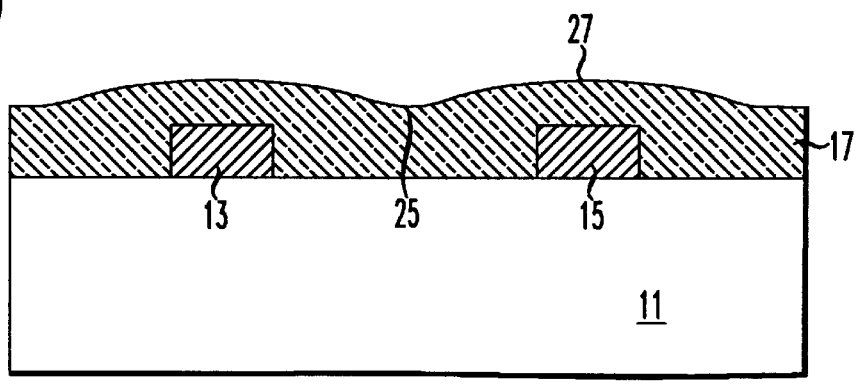
Figure 9:
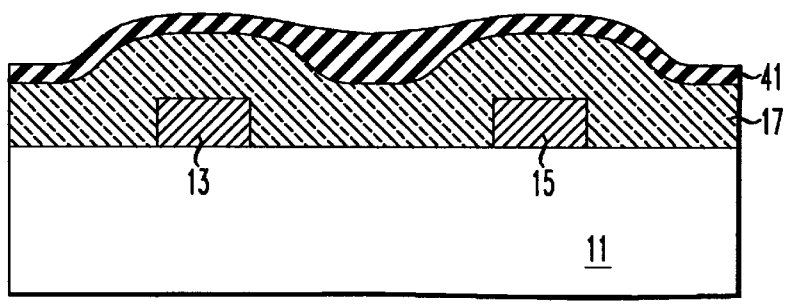
Figure 10:
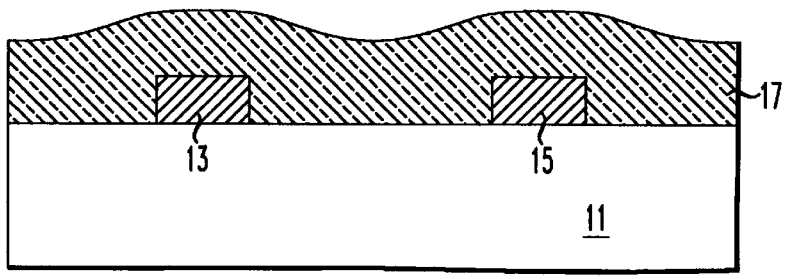

In FIG. 9, an etching process akin to that employed in connection with FIG. 4 may be used to etch photoresist 41 and dielectric 17 at approximately the same rate, yielding smooth or planarized dielectric 17 denoted in FIG. 10.

Figure 8:
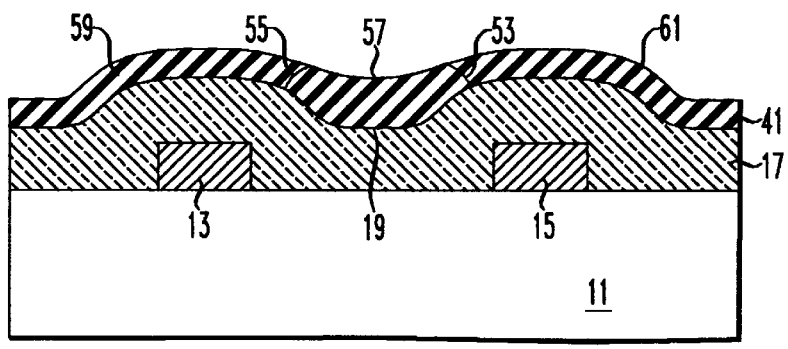

Proper amounts of under exposure and defocus may easily be determined by those of skill in the art. The present process eliminates the need for either inspection or SEM measurement and overly because no pattern is visible. In other words, the pattern of FIG. 8 need not be inspected, while, in previous practice, the pattern of FIG. 2 required inspection. Furthermore, there is no need for the thermal flow step of FIG. 3. In addition, a second application of photoresist, depicted in FIG. 4, is unnecessary because the wafer is illustrated in FIGS. 8 and 9.

Thus, the present invention eliminates the need for processing steps involving thermal flow, photoresist deposition, together with a variety of inspections, measurements and process checks, while achieving desirable planarization.

The invention claimed is:

1. A method of integrated circuit fabrication comprising:

forming a material layer upon a substrate, said material layer having a topography with at least one recess;

forming a layer of photoresist upon said material layer;

under exposing said photoresist to light through a mask, said mask having a feature generally above said recess; said light being defocused; developing said photoresist; etching said photoresist and said material layer at approximately the same rate to thereby smooth said material layer.

2. A method of integrated circuit fabrication comprising:

forming a material layer upon a substrate, said material layer having a topography with at least one recess;

forming a layer of photoresist upon said material layer;

exposing said photoresist to light through a mask; said mask having a feature generally above said recess; said light being defocused under developing said photoresist; etching said photoresist and said material layer at approximately the same rate to thereby smooth said material layer.

3. The method of claim 1 or 2 in which said material layer comprises an oxide of silicon.

4. A method of integrated circuit fabrication, the method comprising:

disposing at least two runners on a substrate;

forming a material layer over said substrate and covering said runners, said material layer having a topography with at least one recess disposed at least partially between said runners;

forming a layer of photoresist upon said material layer;

exposing said photoresist to light through a mask, said mask having a feature generally above said recess; said light being defocused under developing said photoresist; and etching said photoresist and said material layer at approximately the same rate to thereby smooth said material layer.

5. A method as recited in claim 4, wherein said material layer comprises an oxide of silicon.

6. A method of integrated circuit fabrication, the method comprising:

disposing at least two runners on a substrate;

forming a material layer over said substrate and covering said runners, said material layer having a topography with at least one recess disposed at least partially between said runners;

forming a layer of photoresist upon said material layer;

under exposing said photoresist to light through a mask, said mask having a feature generally above said recess; said light being defocused under developing said photoresist; and etching said photoresist and said material layer at approximately the same rate to thereby smooth said material layer.

7. A method as recited in claim 6, wherein said material layer comprises an oxide of silicon.

8. A method of integrated circuit fabrication comprising:

forming a material layer upon a substrate, said material layer having a topography with at least one recess;

forming a layer of photoresist upon said material layer;

under exposing said photoresist to light through a mask, said mask having a feature generally above said said recess, said light being defocused; developing said photoresist; etching said photoresist and said material layer at approximately the same rate to thereby planarize said material layer.

9. A method of integrated circuit fabrication comprising:

forming a material layer upon a substrate, said material layer having a topography with at least one recess;

forming a layer of photoresist upon said material layer;

exposing said photoresist to light through a mask; said mask having a feature generally above said recess, said light being defocused; under developing said photoresist; etching said photoresist and said material layer at approximately the same rate to thereby planarize said material layer.

* * * * *